United States Patent
Lokere (10) Patent No.: US 7,098,733 B1
(45) Date of Patent: Aug. 29, 2006

(54) METHODS AND CIRCUITS FOR SELECTABLE GAIN AMPLIFICATION BY SUBTRACTING GAINS

(75) Inventor: Kristiaan B. Lokere, Westford, MA (US)

(73) Assignee: Linear Technology Corporation, Milpitas, CA (US)

( * ) Notice: Subject to any disclaimer, the term of this patent is extended or adjusted under 35 U.S.C. 154(b) by 138 days.

(21) Appl. No.: 10/897,053

(22) Filed: Jul. 21, 2004

(51) Int. Cl.
*H03F 3/00* (2006.01)

(52) U.S. Cl. ........................ 330/147; 330/254
(58) Field of Classification Search ............... 330/147, 330/254, 69
See application file for complete search history.

(56) References Cited

U.S. PATENT DOCUMENTS

| 4,760,346 A | * | 7/1988 | Kultgen et al. | 330/69 |
| 6,545,534 B1 | * | 4/2003 | Mehr | 330/69 |
| 6,727,749 B1 | * | 4/2004 | Quinn | 330/9 |

OTHER PUBLICATIONS

Burr-Brown Products from Texas Instruments, "INA152 Single-Supply Difference Amplifier", Datasheet (Jan. 2001).
Linear Technology, "LT6011/LT6012 Dual/Quad 135 µA, 14nV/√Hz, Rail-to-Rail Output Precision Op Amp", Datasheet (2003).
Linear Technology, "LTC6910-1 LTC6910-2/LTC6910-3 Digitally Controlled Programmable Gain Amplifiers in SOT-23", Datasheet (2002).
Linear Technology, "LTC6915 Zero Drift, Precision Instrumentation Amplifier with Digitally Programmable Gain", Datasheet (2004).
Texas Instruments, "THS7001, THS7002 70-MHz Programmable-Gain Amplifiers", Datasheet (Oct. 1998-Revised Aug. 1999).

* cited by examiner

*Primary Examiner*—Henry Choe
(74) *Attorney, Agent, or Firm*—Fish & Neave IP Group Ropes & Gray LLP; Mark D. Rowland; Chi-Hsin Chang (57) ABSTRACT

The present invention comprises methods and circuits for increasing the number of selectable gain settings of an amplifier by subtracting gains. In one embodiment, the amplifier is configured with three gain channels that are power-of-three weighted—that is, the gain channels provide gains of 1×, 3× and 9×. By combining the gain values of those gain channels in a manner that adds and/or subtracts the gain values, the amplifier can be configured with any of 13 consecutive gain settings of the same polarity.

34 Claims, 4 Drawing Sheets

METHODS AND CIRCUITS FOR SELECTABLE GAIN AMPLIFICATION BY SUBTRACTING GAINS

FIELD OF THE INVENTION

The present invention relates to selectable gain amplification circuits. More particularly, the present invention relates to methods and circuits for increasing the number of selectable gains by subtracting gains.

BACKGROUND OF THE INVENTION

Many electrical circuits use amplifiers, which amplify one or more input voltages according to a gain setting of the amplifier. One particular type of amplifier is a difference amplifier that accepts two input voltages and supplies an output voltage that is a function of the gain setting of the amplifier and the difference between the two input voltages. A selectable-gain amplifier permits a user to select the gain of the amplifier by use of external components or provision of external signals.

Figure 1A:
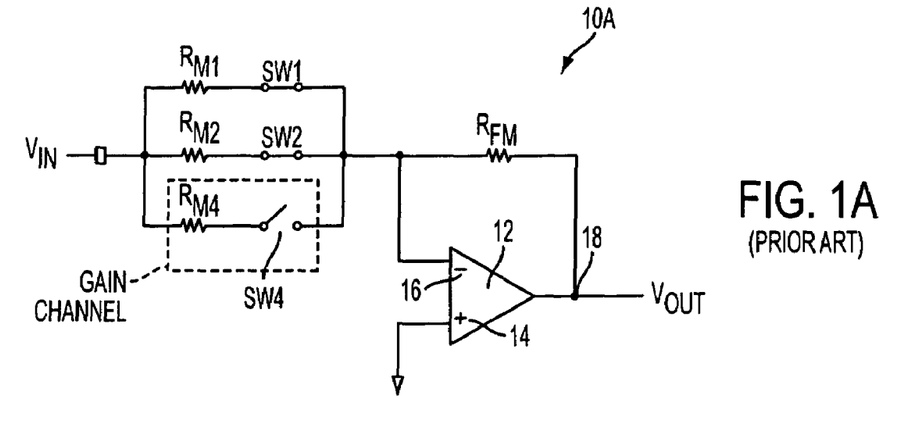
FIGS. 1A and 1B are prior art amplifiers having gain channels that are binary weighted.

FIG. 1A illustrates a prior art circuit having three gain channels, the gains of which are binary weighted. In FIG. 1A, each gain channel has switch SWx that connects input voltage VIN to the gain channel when the switch is closed. Amplifier 10A comprises amplification element 12 (e.g., an operational amplifier) having non-inverting input 14 and inverting input 16. Gain resistors $R_{M1}$, $R_{M2}$ and $R_{M4}$ are electrically coupled between inverting input 16 and input voltage $V_{IN}$ when switches SW1, SW2 and SW4 are closed respectively. Gain resistors $R_{M1}$, $R_{M2}$ and $R_{M4}$ respectively correspond to gain channels having gains of 1×, 2× and 4×. Feedback resistor $R_{FM}$ is connected between inverting input 16 and output node 18. Non-inverting input 14 of amplification element 12 is connected to analog ground. Because the gain channels and feedback resistor $R_{FM}$ are coupled to inverting input 16, amplifier 10A provides inverting gains. To provide binary weighted gains, the nominal resistances of the resistors in amplifier 10A may be chosen so that (1) resistors $R_{FM}$ and $R_{M1}$ have the same nominal resistances, (2) resistor $R_{M2}$ has half the nominal resistance of resistor $R_{FM}$ or $R_{M1}$, and (3) resistor $R_{M4}$ has one-fourth the nominal resistance of resistor $R_{FM}$ or $R_{M1}$.

To configure amplifier 10A with a gain of 1×, SW1 is closed, while switches SW2 and SW4 are left open. Likewise, to configure amplifier 10A with a gain of 2×, SW2 is closed, while switches SW1 and SW4 are left open. Similarly, to configure amplifier 10A with a gain of 4×, SW4 is closed, while switches SW1 and SW2 are left open. Switches SW1, SW2 and SW4 are opened and closed responsive to digital signals.

Amplifier 10A may be configured with additional gains by coupling the gain channels in a manner that adds the gain values of the gain channels. Specifically, the gains are added by closing two or more switches SW1, SW2 and SW4, thereby connecting their respective gain channels together to input voltage $V_{IN}$. For example, as shown in FIG. 1A, amplifier 10A is configured with a gain of 3× by closing switches SW1 and SW2, thereby connecting input voltage $V_{IN}$ to gain channels 1× and 2×. Table 1A provides a chart of connections to configure amplifier 10A with one of seven possible integer gains.

TABLE 1A

| Gain | SW1 | SW2 | SW4 |
|------|--------|--------|--------|
| −1 | closed | open | open |
| −2 | open | closed | open |
| −3 | closed | closed | open |
| −4 | open | open | closed |
| −5 | closed | open | closed |
| −6 | open | closed | closed |
| −7 | closed | closed | closed |

The disadvantage of amplifier 10A having binary weighted gains is that the amplifier can provide only $2^n-1$ different integer gains using n gain channels. Furthermore, because switches SW1, SW2 and SW4 open and close responsive to digital signals, amplifier 10A requires at least one extra input pin to receive the digital signals.

Figure 1B:
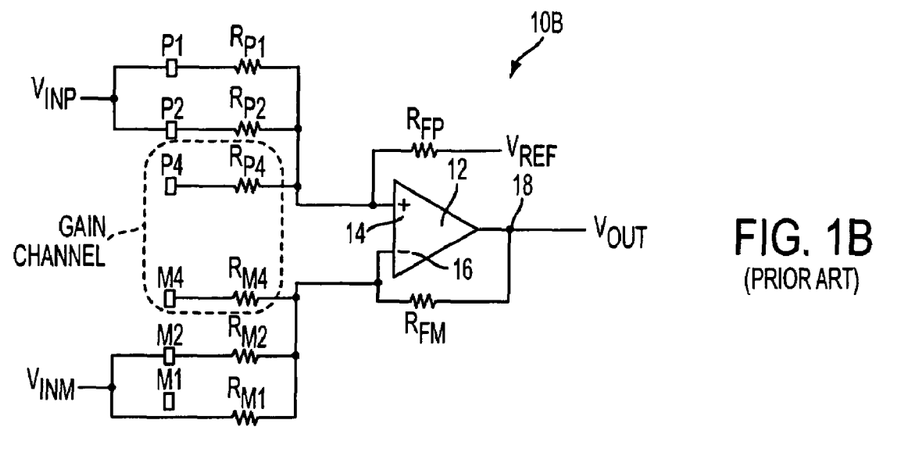

FIG. 1B illustrates a prior art circuit similar to that illustrated in FIG. 1A, the amplifier having three gain channels that are binary weighted. As shown in FIG. 1B, each gain channel has corresponding positive and negative input terminals Px and Mx. Amplifier 10B comprises amplification element 12 (e.g., an operational amplifier) having non-inverting input 14 and inverting input 16. Gain resistors $R_{P1}$, $R_{P2}$ and $R_{P4}$ are coupled between non-inverting input 14 and positive input pins P1, P2 and P4 (respectively). Positive input pins P1, P2 and P4 respectively correspond to gain channels having gains of 1×, 2× and 4×. Reference resistor $R_{FP}$ is connected between non-inverting input 14 and reference voltage $V_{REF}$. Gain resistors $R_{M1}$, $R_{M2}$ and $R_{M4}$ are coupled between inverting input 16 and negative input pins M1, M2 and M4 (respectively). Negative input pins M1, M2 and M4 respectively correspond to gain channels having gains of 1×, 2× and 4×. Feedback resistor $R_{FM}$ is connected between inverting input 16 and output node 18. To provide binary weighted gains, the nominal resistances of the resistors in amplifier 10B may be chosen so that (1) resistors $R_{FP}$, $R_{FM}$, $R_{P1}$ and $R_{M1}$ have the same nominal resistances, (2) each resistor $R_{P2}$ and $R_{M2}$ has half the nominal resistance of resistors $R_{FP}$, $R_{FM}$, $R_{P1}$ or $R_{M1}$, and (3) each resistor RP4 and RM4 has one-fourth the nominal resistance of resistors $R_{FP}$, $R_{FM}$, $R_{P1}$ or $R_{M1}$.

To configure amplifier 10B with a gain of 1×, positive input voltage $V_{INP}$ should be connected to input pin P1 and negative input voltage $V_{INM}$ should be connected to input pin M1. Likewise, to configure amplifier 10B with a gain of 2×, positive and negative input voltages should be connected to input pins P2 and M2, respectively. Similarly, to configure amplifier 10B with a gain of 4×, positive and negative input voltages should be connected to input pins P4 and M4, respectively.

Amplifier 10B may be configured with additional gains by combining the analog inputs in a manner that adds the gain values of the gain channels. Specifically, the gains are added by connecting the positive inputs of the gain channels together to positive input voltage $V_{INP}$ and the negative inputs of the gain channels together to negative input voltage $V_{INM}$. For example, as shown in FIG. 1B, amplifier 10B is configured with a gain of 3× by connecting (1) positive input voltage $V_{INP}$ to input pins P1 and P2, which respectively correspond to the positive inputs of gain channels 1× and 2×, and (2) negative input voltage $V_{INM}$ to input pins M1 and M2, which respectively correspond to the negative inputs of gain channels 1× and 2×. Table 1B provides a chart of connections to configure amplifier 10B with one of seven possible integer gains.

TABLE 1B

| Gain | P1 | P2 | P4 | M1 | M2 | M4 |
|------|------|------|------|------|------|------|
| 1 | V$_{INP}$ | Float | Float | V$_{INM}$ | Float | Float |
| 2 | Float | V$_{INP}$ | Float | Float | V$_{INM}$ | Float |
| 3 | V$_{INP}$ | V$_{INP}$ | Float | V$_{INM}$ | V$_{INM}$ | Float |
| 4 | Float | Float | V$_{INP}$ | Float | Float | V$_{INM}$ |
| 5 | V$_{INP}$ | Float | V$_{INP}$ | V$_{INM}$ | Float | V$_{INM}$ |
| 6 | Float | V$_{INP}$ | V$_{INP}$ | Float | V$_{INM}$ | V$_{INM}$ |
| 7 | V$_{INP}$ | V$_{INP}$ | V$_{INP}$ | V$_{INM}$ | V$_{INM}$ | V$_{INM}$ |

Similar to amplifier 10A of FIG. 1A, one disadvantage of amplifier 10B is that amplifier 10B can provide only $2^n-1$ different integer gains of the same polarity using n gain channels since its gain channels also are binary weighted.

Another prior art circuit that also employs a control input separate from the analog signal input(s) is one in which the control input operates to internally change the gains of the gain channels. An example of such a prior art circuit is a digitally-controlled, variable-gain amplifier. The disadvantages of such a prior art amplifier are that (1) a separate control signal is required, and (2) the precision of the gain channels may degrade when the gain value of the gain channel is changed.

In view of the foregoing, it would be desirable to provide methods and circuits for increasing the number of selectable gain settings of an amplifier, as compared to that of a binary weighted amplifier, without increasing the number of gain channels.

It also would be desirable to provide methods and circuits for increasing the number of selectable gain settings of an amplifier without requiring use of a separate control signal.

SUMMARY OF THE INVENTION

In view of the foregoing, it is an object of the present invention to provide methods and circuits for increasing the number of selectable gain settings of an amplifier, as compared to that of a binary weighted amplifier, without increasing the number of gain channels.

It also is an object of the present invention to provide methods and circuits for increasing the number of selectable gain settings of an amplifier without requiring use of a separate control signal.

These and other objects of the present invention are accomplished by providing methods and circuits for increasing the number of selectable gain settings of an amplifier by subtracting gains. That is, in addition to adding the gains of the gain channels to obtain additional gain settings as described above with respect to binary weighted amplifiers, the present invention further increases the number of selectable gain settings by subtracting the gains of gain channels that are weighted by a scheme other than a binary weighted scheme. For example, if the gains are power-of-three weighted—that is, the gain channels provide gains of 1×, 3× and 9×—the total number of selectable integer gains of the same polarity that can be obtained using n gain channels equals $(3^n-1)/2$. Assuming that there are three gain channels, a power-of-three weighted amplifier provides six more gain settings of the same polarity than that possible with an amplifier that is binary weighted. The gains are added and subtracted by combining the analog signal inputs, without the need for a separate control signal. Each gain channel is internally left intact so that precision is not degraded.

BRIEF DESCRIPTION OF THE DRAWINGS

Further features of the present invention, its nature and various advantages will be more apparent from the accompanying drawings and the following detailed description, in which.

DETAILED DESCRIPTION OF THE INVENTION

Figure 2:
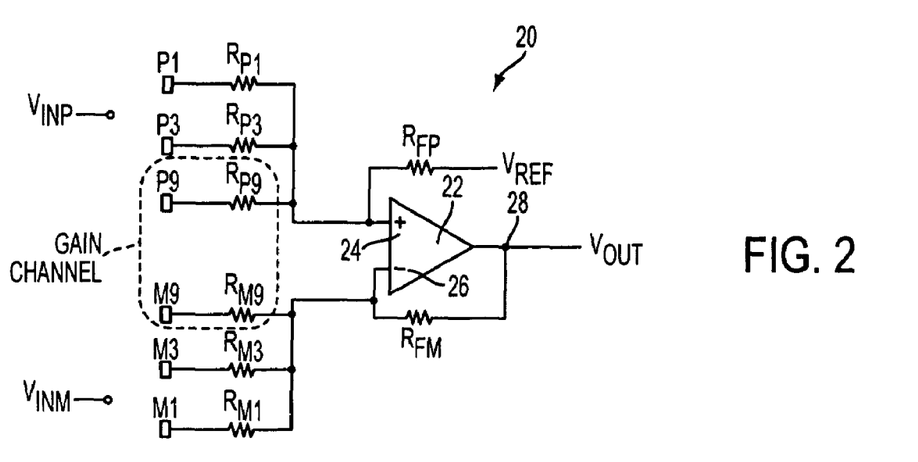
FIG. 2 is one embodiment of an amplifier of the present invention, the amplifier having gain channels that are power-of-three-weighted.

Referring to FIG. 2, a first embodiment of the present invention is illustrated. Difference amplifier 20 comprises amplification element 22 (e.g., an operational amplifier) having non-inverting input 24 and inverting input 26. At output node 28, amplification element 22 supplies an output voltage V$_{OUT}$ that is a function of the difference between positive input voltage V$_{INP}$ and negative input voltage V$_{INM}$, reference voltage V$_{REF}$, and a gain determined by resistors R$_{P1}$, R$_{P3}$, R$_{P9}$, R$_{M1}$, R$_{M3}$, R$_{M9}$, R$_{FP}$ and R$_{FM}$. Reference resistor R$_{FP}$ is connected between non-inverting input 24 and reference voltage V$_{REF}$, whereas feedback resistor R$_{FM}$ is connected between inverting input 26 and output node 28. Positive gain resistors R$_{P1}$, R$_{P3}$ and R$_{P9}$ are connected between non-inverting input 24 and respective positive input terminals P1, P3 and P9. Likewise, negative gain resistors R$_{M1}$, R$_{M3}$ and R$_{M9}$ are connected between inverting input 26 and respective negative input terminals M1, M3 and M9. One of ordinary skill in the art will recognize that positive input voltage V$_{INP}$ and negative input voltage V$_{INM}$ may have negative or positive voltage values. That is, either or both positive input voltage V$_{INP}$ and/or negative input voltage V$_{INM}$ could be a positive or negative value. The "P" and "M" notation only refers to the polarity of the gain that is applied and not to the value of the signal.

According to the principles of the present invention, the gain channels of amplifier 20 have a weighting other than binary weighting. In the embodiment of FIG. 2, a gain channel comprises two analog signal inputs—that is, positive input terminal Px and negative input terminal Mx. In a preferred embodiment, the gain channels are power-of-three weighted—that is, the gain channels provide gains of 1×, 3× and 9×. To configure amplifier 20 with power-of-three weighting, gain resistors R$_{P1}$ and R$_{M1}$ may have the same nominal resistance as reference resistor R$_{FP}$ and feedback resistor R$_{FM}$, gain resistors R$_{P3}$ and R$_{M3}$ may have a nominal resistance that is one-third that of resistors R$_{P1}$, R$_{M1}$, R$_{FP}$ or R$_{FM}$, and gain resistors R$_{P9}$ and R$_{M9}$ may have a nominal resistance that is one-ninth that of resistors R$_{P1}$, R$_{M1}$, R$_{FP}$ or R$_{FM}$.

To configure amplifier 20 with a gain of 1×, positive input voltage V$_{INP}$ should be connected to input pin P1 and negative input voltage $V_{INM}$ to input pin M1. Likewise, to configure amplifier 20 with a gain of 3×, positive and negative input voltages should be connected to input pins P3 and M3, respectively. Similarly, to configure amplifier 20 with a gain of 9×, positive and negative input voltages should be connected to input pins P9 and M9, respectively.

Figure 3:
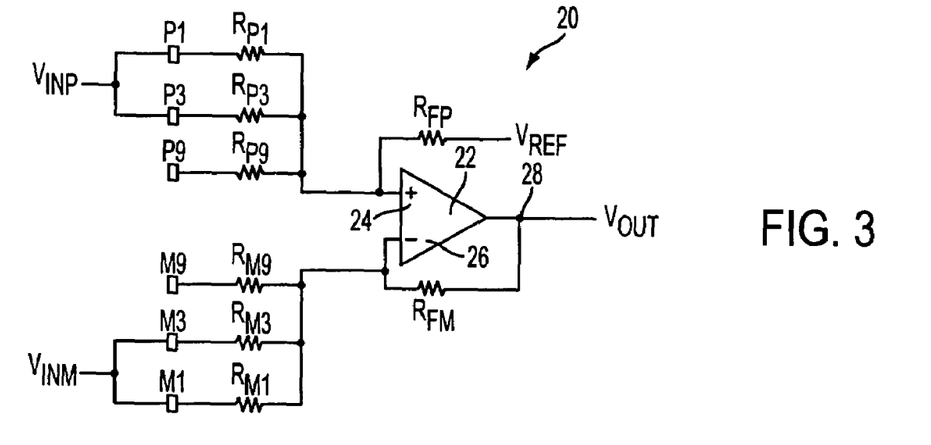
FIG. 3 is the power-of-three weighted amplifier of FIG. 2 configured with a gain setting of 4×.

Amplifier 20 may be configured with additional integer gains by combining the analog inputs in a manner that adds the original gains. Specifically, gain settings that are the sum of gains 1×, 3× and 9× can be obtained by connecting positive input voltage $V_{INP}$ to more than one positive input terminals P1, P3 and P9, and simultaneously connecting negative input voltage $V_{INM}$ to complementary negative input terminals M1, M3 and M9. For example, as shown in FIG. 3, amplifier 20 is configured with a gain of 4× by connecting (1) positive input voltage $V_{INP}$ to input pins P1 and P3, which respectively correspond to the positive inputs of gain channels 1× and 3×, and (2) negative input voltage $V_{INM}$ to input pins M1 and M3, which respectively correspond to the negative inputs of gain channels 1× and 3×. Likewise, gains of 10×, 12× and 13× also may be obtained by combining the analog inputs in a manner that adds the original gains.

Figure 4:
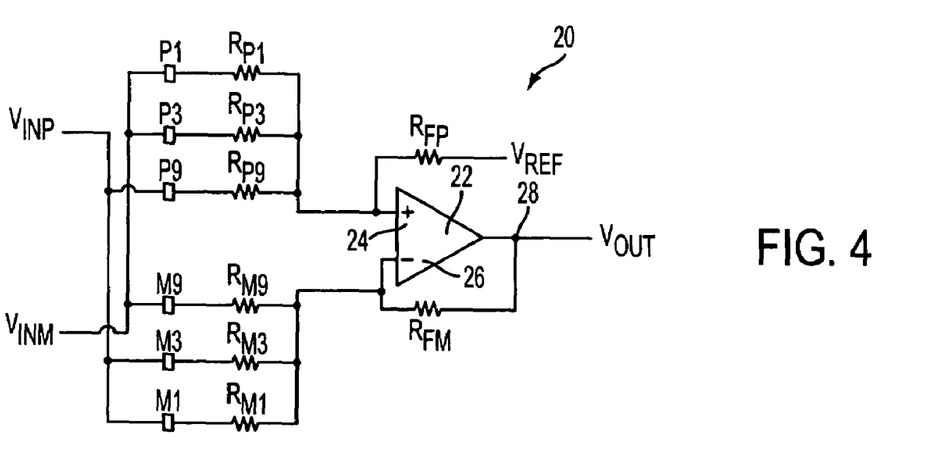
FIG. 4 is the power-of-three weighted amplifier of FIG. 2 configured with a gain setting of 5×.

Pursuant to the principles of the present invention, amplifier 20 may be configured with gains 2×, 5×, 6× and 8× by combining the analog inputs in a manner that subtracts the original gains. That is, gain settings that are the difference of gains 1×, 3×, and 9× can be obtained by connecting positive input voltage $V_{INP}$ to a combination of positive and negative input terminals and connecting negative input voltage $V_{INM}$ to a combination of complementary negative and positive input terminals. For example, FIG. 4 illustrates amplifier 20 configured with a combination gain value of 5×. Positive input voltage $V_{INP}$ is connected to input pins P9, M3 and M1, which respectively correspond to the positive input of gain channel 9× and the negative inputs of gain channels 3× and 1×. Negative input voltage $V_{INM}$ is connected to input pins M9, P3 and P1, which respectively correspond to the negative input of gain channel 9× and positive inputs of gain channels 3× and 1×. Other gain combinations can be obtained by similarly subtracting a smaller gain from a larger gain. Negative gains can be obtained by subtracting a larger gain from a smaller gain.

To configure amplifier 20 with gains 7× and 11×, the analog inputs may be combined in a manner that both subtracts and adds the original gains. For example, to obtain a gain of 7×, positive input voltage $V_{INP}$ should be connected to input pins P9, P1 and M3, and negative input voltage $V_{INM}$ should be connected to input pins M9, M1 and P3. This configuration adds gains 9× and 1× and subtracts gain 3×.

Table 2 provides a chart of connections for configuring difference amplifier 20 with one of 13 possible positive integer gains when the amplifier has three power-of-three weighted gain channels. Using Table 2, output voltage $V_{OUT}$ may be calculated according to the following equation:

$$V_{OUT} = V_{REF} + 3^0(V_{P1} - V_{M1}) + 3^1(V_{P3} - V_{M3}) + 3^2(V_{P9} - V_{M9})$$

where $V_{P1}$ is the voltage at input pin P1, $V_{M1}$ is the voltage at input pin M1, $V_{P3}$ is the voltage at input pin P3, $V_{M3}$ is the voltage at input pin M3, $V_{P9}$ is the voltage at input pin P9 and $V_{M9}$ is the voltage at input pin M9. This equation assumes that the nominal resistance of resistors $R_{FP}$ and $R_{FM}$ equal the nominal resistances of gain resistors $R_{P1}$ and $R_{M1}$, and that the gain channels are power-of-three weighted.

TABLE 2

| Gain | P1 | P3 | P9 | M1 | M3 | M9 |
|---|---|---|---|---|---|---|
| 1 | $V_{INP}$ | Float | Float | $V_{INM}$ | Float | Float |
| 2 | $V_{INM}$ | $V_{INP}$ | Float | $V_{INP}$ | $V_{INM}$ | Float |
| 3 | Float | $V_{INP}$ | Float | Float | $V_{INM}$ | Float |
| 4 | $V_{INP}$ | $V_{INP}$ | Float | $V_{INM}$ | $V_{INM}$ | Float |
| 5 | $V_{INM}$ | $V_{INM}$ | $V_{INP}$ | $V_{INP}$ | $V_{INP}$ | $V_{INM}$ |
| 6 | Float | $V_{INM}$ | $V_{INP}$ | Float | $V_{INP}$ | $V_{INM}$ |
| 7 | $V_{INP}$ | $V_{INM}$ | $V_{INP}$ | $V_{INM}$ | $V_{INP}$ | $V_{INM}$ |
| 8 | $V_{INM}$ | Float | $V_{INP}$ | $V_{INP}$ | Float | $V_{INM}$ |
| 9 | Float | Float | $V_{INP}$ | Float | Float | $V_{INM}$ |
| 10 | $V_{INP}$ | Float | $V_{INP}$ | $V_{INM}$ | Float | $V_{INM}$ |
| 11 | $V_{INM}$ | $V_{INP}$ | $V_{INP}$ | $V_{INP}$ | $V_{INM}$ | $V_{INM}$ |
| 12 | Float | $V_{INP}$ | $V_{INP}$ | Float | $V_{INM}$ | $V_{INM}$ |
| 13 | $V_{INP}$ | $V_{INP}$ | $V_{INP}$ | $V_{INM}$ | $V_{INM}$ | $V_{INM}$ |

Advantageously, by subtracting gains, an amplifier may be configured with a greater number of possible gain settings. If the gain channels of an amplifier are weighted by a power-of-three weighting, the amplifier can be configured with any of $(3^n-1)/2$ selectable integer gains of the same polarity when the amplifier has n gain channels. Assuming that the amplifier is configured with three gain channels that are weighted by a power-of-three weighting, the amplifier may provide six more consecutive gain settings of the same polarity than that possible with a similar amplifier that is binary weighted. Furthermore, because additional gains are obtained by subtracting the analog signal inputs, there is less need for a separate control signal that may degrade the precision of the gain channel.

In a preferred embodiment of the present invention, amplification element 22 is a precision operational amplifier similar to the LT6011 operational amplifier manufactured by Linear Technology Corporation of Milpitas, Calif. For precision operational amplifiers having low input offset current, the amplifier may exhibit improved accuracy if the source resistances seen by non-inverting input 24 and inverting input 26 are matched.

Also, in a preferred embodiment, the resistors of amplifier 20 are precision-matched SiCr-based elements protected with barrier metal. If amplifier 20 is integrated into an integrated circuit (IC), gain resistors $R_{P1}$ and $R_{M1}$ may be isolated from the substrate of the IC so that the voltages applied to input terminals P1 and M1 can be taken beyond the voltages supplying operational amplifier 22.

In a preferred embodiment, input terminals P3, M3, P9 and M9 are connected through diodes to internal manufacturing post-package trim circuitry and through a substrate diode to the negative power supply for operational amplifier 22, whereas input terminals P1 and M1 are not connected to clamp diodes, substrate diodes or trim circuitry. For such a configuration, the voltage applied to input pins P3, M3, P9 and M9 is bounded by a diode drop outside of the positive and negative supply voltages, whereas the voltage applied to input pins P1 and M1 can be taken well outside the supply rails.

Furthermore, the input voltage range of operational amplifier 22 may extend to within the voltages of the supply rails or to voltages within predetermined offsets of the supply rails. One of ordinary skill in the art will recognize that this input voltage range will depend on the design of operational amplifier 22. Moreover, to obtain the desired gain, the output of operational amplifier 22 must not be clipped.

While the amplifiers of the present invention are illustrated herein as having three gain channels, one of ordinary skill in the art will recognize that any number of gain channels may be employed without departing from the principles of the present invention. For example, if two gain channels are employed, a power-of-three weighted amplifier would permit the amplifiers to be configured with one more gain setting than a binary weighted amplifier. Likewise, if four gain channels are employed, a power-of-three weighted amplifier would permit the amplifier to be configured with 25 more gain settings of the same polarity than a similarly configured binary weighted amplifier.

Furthermore, one of ordinary skill in the art will recognize that the amplifiers of the present invention may employ gains that are not power-of-three weighted. That is, the amplifiers may employ gain channels that are not power-of-three weighted, but that still allow the amplifiers to be configured with an increased number of selectable gain settings by subtracting gains. For example, if amplifier 20 is power-of-four weighted, amplifier can still be configured with up to $(3^n-1)/2$ gain settings of the same polarity. Specifically, the amplifier can be configured with any of the following non-consecutive gains of the same polarity: 1×, 3×, 4×, 5×, 11×, 12×, 13×, 15×, 16×, 17×, 19×, 20× and 21×.

Indeed, the gain channels of the amplifiers of the present invention do not have to be power weighted at all. For example, amplifier 20 also may comprise gain channels having gains of 1×, 3× and 10×. In this case, the total number of non-consecutive gain settings of the same polarity available equals 13 gains. Alternatively, amplifier 20 may comprise gain channels having gains of 1×, 3× and 8×. In this case, the total number of consecutive gains of the same polarity available equals 12.

In a further alternative embodiment of the present invention, the amplifiers of the present invention may be configured so that the amplifier accepts and amplifies only a single input voltage (hereinafter referred to as "single-ended gain"), rather than the difference between two input voltages. For example, amplifier 20 in either FIG. 3 or 4 may be configured to provide single-ended gains by grounding negative input voltage $V_{INM}$ or positive input voltage $V_{INP}$. If positive input voltage $V_{INP}$ is grounded, amplifier 20 provides inverting gains. When either positive input voltage $V_{INP}$ or negative input voltage $V_{INM}$ is grounded, the amplifier can still be configured to achieve the desired gain settings by connecting positive input voltage $V_{INP}$ and negative input voltage $V_{INM}$ to the positive and negative input terminals as described above with respect to FIGS. 2–4.

The amplifiers of the present invention also may be configured to provide inverting gains by subtracting a larger gain from a smaller gain. For example, to obtain a gain of −2×, amplifier 20 may be configured such that positive input voltage $V_{INP}$ is connected to input terminals P1 and M3, whereas negative input voltage $V_{INM}$ is connected to input terminals M1 and P3.

While the amplifiers of the present invention provide integer gains, one of ordinary skill in the art also will recognize that the amplifiers also may be configured to provide gain channels with decimal gains by, e.g., using reference resistor $R_{FP}$ and/or feedback resistor $R_{FM}$ having nominal resistances that are different than the nominal resistances of gain resistors $R_{P1}$, $R_{P3}$, $R_{P9}$, $R_{M1}$, $R_{M3}$ and $R_{M9}$.

One of ordinary skill in the art also will recognize that none of the resistors in amplifier 20 have to have the same nominal resistance. Although changing the nominal resistance of any of the resistors may change the gains for which amplifier 20 is configured, the principles of the present invention still apply—that is, adding and/or subtracting gains to increase the total number of selectable gain settings available.

Figure 5:
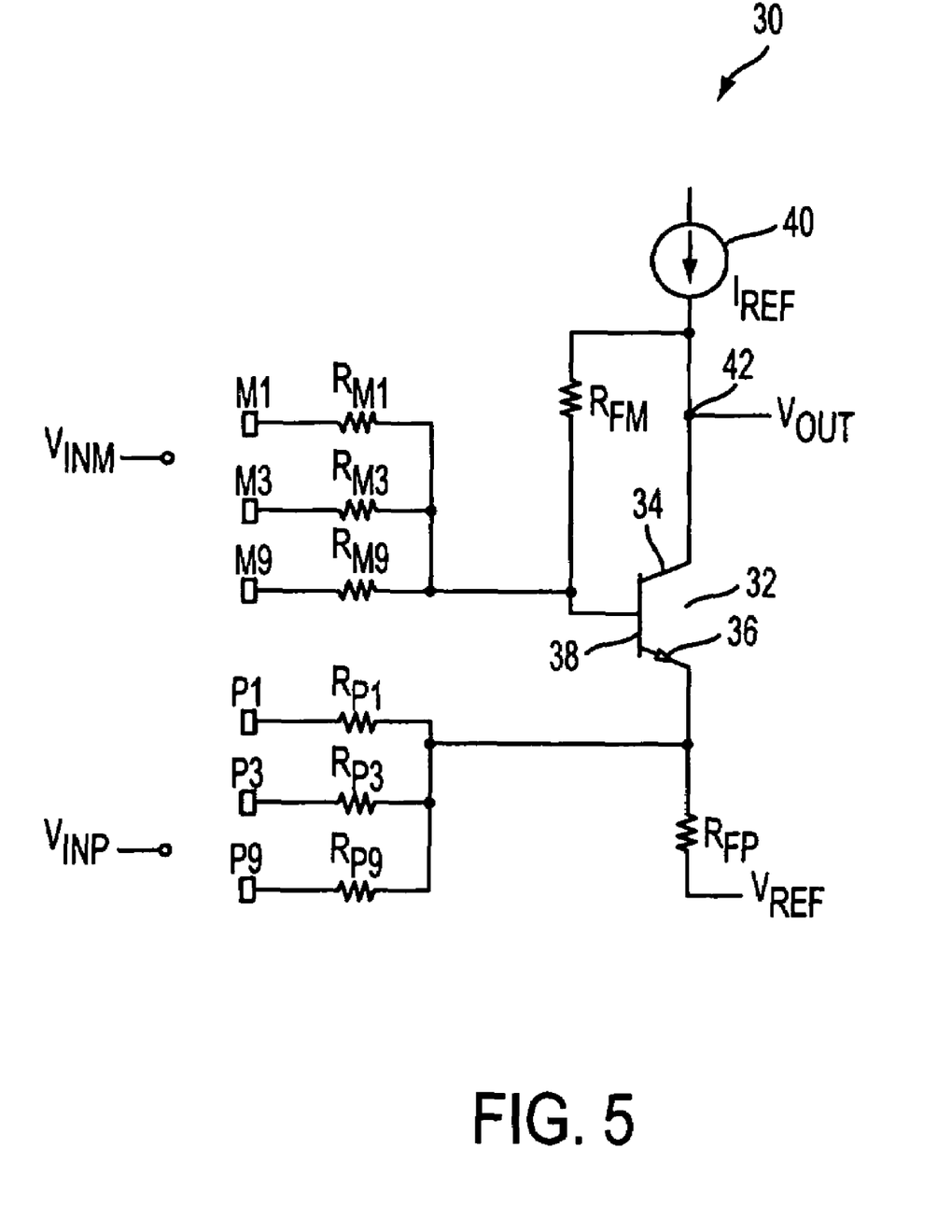
FIG. 5 is a second embodiment of an amplifier of the present invention, the amplifier employing a transistor as the amplification element rather than an operational amplifier.

In an alternative embodiment of the present invention, amplification element 22 of amplifier 20 may comprise an operational transconductance amplifier or a transistor, rather than an operational amplifier. FIG. 5 illustrates amplifier 30, which incorporates amplification element 32. Amplification element 32 comprises a bipolar junction transistor (BJT) having collector 34, emitter 36 and base 38. Reference current source 40 supplies collector 34 with constant reference current $I_{REF}$ that biases transistor 32 in the active region. Amplifier 30 also comprises (1) reference resistor $R_{FP}$ connected between emitter 36 and reference voltage $V_{REF}$, and (2) feedback resistor $R_{FM}$ connected between collector 34 and base 38. Gain resistors $R_{P1}$, $R_{P3}$ and $R_{P9}$ are connected between emitter 36 and respective positive input terminals P1, P3 and P9. Likewise, gain resistors $R_{M1}$, $R_{M3}$ and $R_{M9}$ are connected between base 38 and respective input terminals M1, M3 and M9.

Assuming a small signal analysis, transistor 32 amplifies the difference in the voltages at base 38 and emitter 36. That is, transistor 32 effectively behaves as a voltage-controlled current source, in which emitter 36 acts as the non-inverting input and base 38 acts as the inverting input. The current path from collector 34 to emitter 36 acts as the output of the voltage-controlled current source, pulling a current that is the sum of reference current $I_{REF}$ and the current flowing through feedback resistor $R_{FM}$. This collector current establishes a voltage at output node 42 that is a function of the gain setting of amplifier 30, the difference between positive input voltage $V_{INP}$ and negative input voltage $V_{INM}$, and a constant voltage offset that is a function of reference voltage $V_{REF}$ and reference current $I_{REF}$. The gain setting of amplifier 30 is a function of reference current $I_{REF}$, gain resistors $R_{Px}$ and $R_{Mx}$, reference resistor $R_{FP}$ and feedback resistor $R_{FM}$. One of ordinary skill in the art will recognize that the resistances of resistors $R_{Px}$, $R_{Mx}$, $R_{FP}$ and $R_{FM}$ are selected to establish the gain values of the gain channels of amplifier 30.

Pursuant to the principles of the present invention, amplifier 30 operates in a manner similar to that of amplifier 20 of FIGS. 2–4 as described above. Specifically, the number of available gains provided by amplifier 30 may be increased by subtracting gains. For example, assuming that the nominal resistances of the resistors in amplifier 30 are selected so that input terminals P1 and M1 correspond to a gain channel of 1×, input terminals P3 and M3 correspond to a gain channel of 3×, and input terminals P9 and M9 correspond to a gain channel of 9×, a gain of 4× may be obtained by connecting positive input voltage $V_{INP}$ to positive input terminals P1 and P3 and connecting negative input voltage $V_{INM}$ to negative input terminals M1 and M3. Likewise, a gain of 7× may be obtained by connecting positive input voltage $V_{INP}$ to input terminals P1, P9 and M3 and connecting negative input voltage $V_{INM}$ to negative input terminals M1, M9 and P3. The remaining selectable positive integer gains may be obtained in accordance with Table 2.

As used herein, when gain channels or gain values are binary weighted, the gain values of all the gain channels are consecutive powers of two. When gain channels or gain values have a weighting other than binary weighting, at least one of the gain values of the gain channels is not a power of two. Gain channels or gain values having a weighting other than binary weighting includes but is not limited to gain channels having gains of 1×, 2× and 7×, or gain channels having gains of 2×, 4× and 9×.

One of ordinary skill in the art will recognize that the present invention also may be adapted to amplify currents instead of voltages in accordance with the principles of the present invention as described above.

While preferred illustrative embodiments of the present invention are described above, it will be apparent to one skilled in the art that various changes and modifications may be made therein without departing from the invention.

Figure 6A:
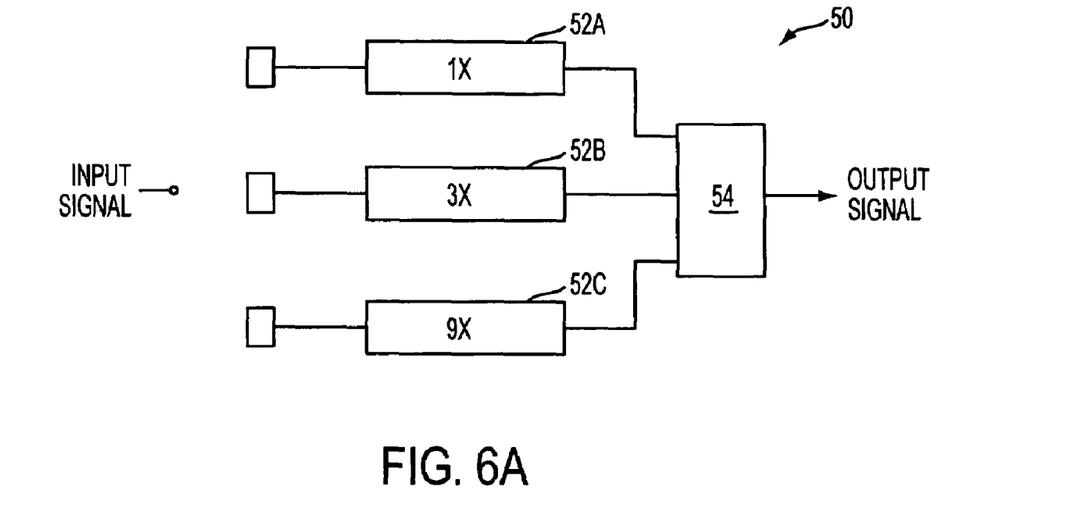
FIGS. 6A and 6B are amplifiers of the present invention that comprise gain channels that accept a single input signal rather than two input signals.

For example, while the amplifiers discussed above with respect to FIGS. 2–5 describe each gain channel as having two analog inputs—that is, a positive input coupled to the non-inverting input of an operational amplifier (or, e.g., a transconductance operational amplifier or a transistor) and a negative input coupled to the inverting input of the operational amplifier (or, e.g., the transconductance operational amplifier or the transistor)—each gain channel may comprise only a single analog input. For example, in FIG. 6A, amplifier 50 comprises three gain channels 52A–C that are power-of-three weighted and addition/subtraction circuit 54. The input signal may be coupled to one or more gain channels 52A–C. Addition/subtraction circuit 54 accepts signals from gain channels 52A–C, adds and/or subtracts the signals, and outputs an output signal that is a function of the gain of amplifier 50 and the input signal. The resulting gain of amplifier 50 is a combination of the gain values of the gain channels that are coupled to the input signal and addition/subtraction circuit 54. The gain setting of amplifier 50 may be configurable based on application of programming or control signals to addition/subtraction circuit 54, or may be configured as a permanent configuration. Even though amplifier 50 may accept additional signals, amplifier 50 permits an input signal to be amplified by more gain settings than that available from individual gain channels 52A–C and from only adding the gain values of gain channels 52A–C.

Figure 6B:
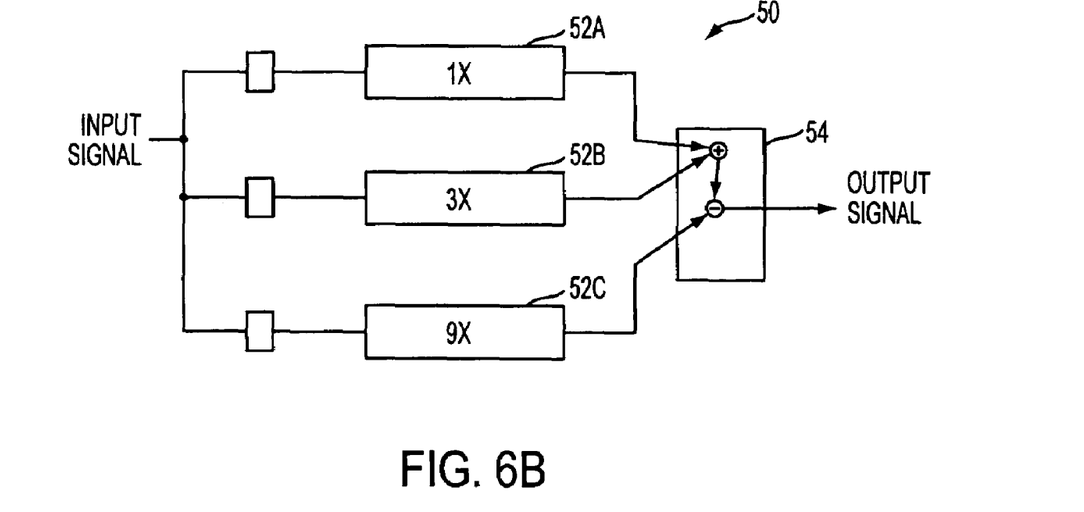

For example, in FIG. 6B, amplifier 50 is configured for a combination gain value of 5×. The input signal is coupled to gain channels 52A–C, which in turn are coupled to addition/subtraction circuit 54. Addition/subtraction circuit 54 adds the gains of gain channels 52A and 52B, which respectively correspond to gain values of 1× and 3×, and subtracts those gains from the gain of gain channel 52C, which corresponds to a gain value of 9×. The output signal is a function of the input signal and the 5× combination gain value.

Illustratively, a single input signal may be coupled to multiple gain channels having different gain values. Each gain channel may be connected to respective amplification elements, wherein either a non-inverting input or an inverting input of each amplification element is inaccessible to a user and fed back to an output of the amplification element via one or more feedback resistors. Alternatively, the inaccessible input of the amplification element may be grounded and feedback resistors may be coupled to the accessible input of the amplification element. The gain of each gain channel would be a function of the feedback resistors. The outputs of the amplification elements of the multiple gain channels may be added and/or subtracted using, e.g., summing amplifiers or difference amplifiers (respectively) to obtain a final output signal having a gain that is a combination of two or more of the gains of the individual gain channels.

Also, any one or more of gain resistors $R_{Px}$ and $R_{Mx}$, reference resistor $R_{FP}$ and feedback resistor $R_{FM}$ may be replaced with another type of coupling element having impedance, e.g., capacitors, inductors, switches or a combination thereof. Furthermore, while amplification element 32 of FIG. 5 comprises a BJT, one of ordinary skill in the art will recognize that the BJT may be replaced with another type of transistor, such as, e.g., a field effect transistor. The appended claims are intended to cover all such changes and modifications that fall within the true spirit and scope of the invention.

What is claimed is:

1. A method for amplifying at least one input signal, the method comprising:
    providing a first gain channel having a first gain value and a first gain channel input terminal;
    providing a second gain channel having a second gain value and a second gain channel input terminal;
    providing a third gain channel having a third gain value and a third gain channel input terminal, wherein the first, second, and third gain channels have a weighting other than binary weighting; and
    producing an amplified signal by amplifying the at least one input signal by a combination gain value equal to a combination of at least the first and second gain values, wherein at least the second gain value is subtracted from at least the first gain value.

2. The method of claim 1, wherein producing an amplified signal comprises producing an amplified signal by amplifying the at least one input signal by a combination gain value equal to a combination of at least the first, second and third gain values.

3. The method of claim 1, further comprising providing an amplification element having non-inverting and inverting amplification inputs,
    wherein providing a first gain channel further comprises providing a first gain channel having a fourth gain channel input terminal,
    wherein providing a second gain channel further comprises providing a second gain channel having a fifth gain channel input terminal,
    wherein providing a third gain channel further comprises providing a third gain channel having a sixth gain channel input terminal,
    wherein the first, second and third gain channel input terminals are coupled to the non-inverting amplification input and the fourth, fifth and sixth gain channel input terminals are coupled to the inverting amplification input.

4. The method of claim 3, further comprising providing feedback from the amplified signal to either the inverting or non-inverting amplification inputs.

5. The method of claim 3, wherein the amplification element comprises an operational amplifier.

6. The method of claim 3, wherein the amplification element comprises a transconductance operational amplifier.

7. The method of claim 3, wherein the amplification element comprises a transistor.

8. The method of claim 1, wherein the at least one input signal comprises first and second input signals, and
    wherein producing an amplified signal comprises producing an amplified signal by amplifying the difference between the first and second input signals by the combination gain value.

9. The method of claim 1, further comprising:
    providing a plurality of coupling elements having impedance, the plurality of coupling elements coupled to at least one of the first, second and third gain channel input terminals,
    wherein providing a first gain channel having a first gain value comprises providing a first gain channel having a first gain value that is a function of at least a first element of the plurality of coupling elements, wherein providing a second gain channel having a second gain value comprises providing a second gain channel having a second gain value that is a function of at least a second element of the plurality of coupling elements, and wherein providing a third gain channel having a third gain value comprises providing a third gain channel having a third gain value that is a function of at least a third element of the plurality of coupling elements.

10. The method of claim 9, wherein the plurality of coupling elements comprises resistors.

11. The method of claim 9, wherein the plurality of coupling elements comprises capacitors, inductors, switches or a combination thereof.

12. The method of claim 1, wherein the first, second and third gain channels are power-of-three weighted.

13. The method of claim 1, wherein providing a third gain channel having a third gain value comprises providing a third gain channel having a third gain value that permits amplification of the at least one input signal by any of 13 possible gain values of the same polarity.

14. The method of claim 13, wherein the 13 possible gain values are consecutive.

15. A method for amplifying the difference between first and second input signals, the method comprising:

providing a first gain channel having a first gain value, a first positive input terminal and a first negative input terminal;

providing a second gain channel having a second gain value, a second positive input terminal and a second negative input terminal;

providing a third gain channel having a third gain value, a third positive input terminal and a third negative input terminal, wherein the first, second, and third gain channels have a weighting other than binary weighting;

providing an amplification element having non-inverting and inverting amplification inputs, wherein the first, second and third positive input terminals are coupled to the non-inverting amplification input and the first, second and third negative input terminals are coupled to the inverting amplification input;

connecting the first input signal to the first positive input terminal and the second negative input terminal;

connecting the second input signal to the first negative input terminal and the second positive input terminal;

amplifying the difference between the first and second input signals by a combination gain value equal to a combination of at least the first and second gain values, wherein at least the second gain value is subtracted from at least the first gain value.

16. The method of claim 15, wherein amplifying the difference between the first and second input signals comprises amplifying the difference between the first and second input signals by a combination gain value equal to a combination of at least the first, second and third gain values.

17. The method of claim 15, further comprising grounding the first or second input signal.

18. The method of claim 15, further comprising providing a plurality of coupling elements having impedance, the plurality of coupling elements connected to the first, second and third positive input terminals and the first, second and third negative input terminals; and setting the first, second and third gain values by selecting the plurality of coupling elements.

19. The method of claim 15, wherein the first, second and third gain channels are power-of-three weighted.

20. The method of claim 15, wherein providing a third gain channel having a third gain value comprises providing a third gain channel having a third gain value that permits amplification of the difference between the first and second input signals by any of 13 possible gain values of the same polarity.

21. The method of claim 20, wherein the 13 possible gain values are consecutive.

22. An amplifier for amplifying the difference between first and second input signals, the amplifier comprising:

a first gain channel having a first gain value and first positive and negative input terminals;

a second gain channel having a second gain value and second positive and negative input terminals;

a third gain channel having a third gain value and third positive and negative input terminals, wherein the first, second and third gain channels have a weighting other than binary weighting; and an amplification element having non-inverting and inverting amplification inputs, wherein the first, second and third positive input terminals are coupled to the non-inverting amplification input and the first, second and third negative input terminals are coupled to the inverting amplification input, wherein the first input signal is connected to the first positive input terminal and the second negative input terminal, wherein the second input signal is connected to the first negative input terminal and the second positive input terminal, and wherein the amplification element is configured to amplify the difference between the first and second input signals by a combination gain value that is equal to the difference between the first and second gain values.

23. An amplifier for amplifying the difference between first and second input signals, the amplifier comprising:

a first gain channel having a first gain value, a first positive input terminal for receiving the first input signal, and a first negative input terminal for receiving the second input signal;

a second gain channel having a second gain value, a second positive input terminal for receiving the second input signal, and a second negative input terminal for receiving the first input signal;

a third gain channel having a third gain value, a third positive input terminal and a third negative input terminal, wherein the first, second, and third gain channels have a weighting other than binary weighting; and an amplification element having non-inverting and inverting amplification inputs, wherein the first, second and third positive input terminals are coupled to the non-inverting amplification input and the first, second and third negative input terminals are coupled to the inverting amplification input, wherein the amplification element is configured to produce an amplified signal that is a function of the difference between the first and second input signals multiplied by a combination gain value equal to a combination of at least the first and second gain values, wherein at least the second gain value is subtracted from at least the first gain value.

24. The amplifier of claim 23, wherein the combination of at least the first and second gain values comprises a combination of at least the first, second and third gain values.

25. The amplifier of claim 23, further comprising feedback from the amplified signal to either the inverting or non-inverting amplification inputs.

26. The amplifier of claim 23, wherein the amplification element comprises an operational amplifier.

27. The amplifier of claim 23, wherein the amplification element comprises a transconductance operational amplifier.

28. The amplifier of claim 23, wherein the amplification element comprises a transistor.

29. The amplifier of claim 23, further comprising a plurality of coupling elements having impedance, the plurality of coupling elements coupled to the first, second and third positive input terminals and coupled to the first, second and third negative input terminals, wherein the first gain value is a function of at least a first pair of the plurality of coupling elements, the second gain value is a function of at least a second pair of the plurality of coupling elements, and the third gain value is a function of at least a third pair of the plurality of coupling elements.

30. The amplifier of claim 29, wherein the plurality of coupling elements comprises resistors.

31. The amplifier of claim 29, wherein the plurality of coupling elements comprises capacitors, inductors, switches or a combination thereof.

32. The amplifier of claim 23, wherein the first, second and third gain values are power-of-three weighted.

33. The amplifier of claim 23, wherein the third gain value permits amplification of the difference between the first and second input signals by any of 13 possible gain values of the same polarity.

34. The amplifier of claim 33, wherein the 13 possible gain values are consecutive.

* * * * *